United States Patent
Chen

[19]

[11] Patent Number: 5,834,375
[45] Date of Patent: Nov. 10, 1998

[54] CHEMICAL-MECHANICAL POLISHING PLANARIZATION MONITOR

[75] Inventor: Lai-Juh Chen, Hsin-Chu, Taiwan

[73] Assignee: Industrial Technology Research Institute, Hsin-Chu, Taiwan

[21] Appl. No.: 694,726

[22] Filed: Aug. 9, 1996

[51] Int. Cl.⁶ .................................................. H01L 21/00
[52] U.S. Cl. .......................... 438/692; 438/693; 438/788; 438/14; 216/38; 216/85
[58] Field of Search .................... 216/38, 85, 90, 216/99, 89; 438/747, 756, 788, 14, 692, 693

[56] References Cited

U.S. PATENT DOCUMENTS

| | | | |
|---|---|---|---|
| 5,234,868 | 8/1993 | Cote | 437/225 |
| 5,328,553 | 7/1994 | Poon | 156/636 |
| 5,413,941 | 5/1995 | Roos et al. | 437/8 |
| 5,575,706 | 11/1996 | Tsai et al. | 451/41 |
| 5,609,718 | 3/1997 | Meikle | 156/626.1 |
| 5,637,031 | 6/1997 | Chen | 451/41 |
| 5,667,629 | 9/1997 | Pan et al. | 438/13 |
| 5,705,435 | 1/1998 | Chen | 438/8 |

*Primary Examiner*—Nam Nguyen
*Assistant Examiner*—Steven H. VerSteeg
*Attorney, Agent, or Firm*—George O. Saile; Stephen B. Ackerman

[57] ABSTRACT

An improved and new process for chemical-mechanical polishing (CMP) of a substrate surface, wherein the endpoint for the planarization process is detected by monitoring the ratio of the rate of insulator material removal over a pattern feature to the rate of insulator material removal over an area without an underlying pattern feature, has been developed.

4 Claims, 2 Drawing Sheets

CHEMICAL-MECHANICAL POLISHING PLANARIZATION MONITOR

BACKGROUND OF THE INVENTION

(1) Field of the Invention

This invention relates to a method for determining planarization endpoint in a chemical-mechanical polishing (CMP) process for polishing the surface of a semiconductor substrate. More specifically, the invention is directed to the method of detecting planarization endpoint when polishing to a planar condition a semiconductor substrate which contains topographic features, resulting from deposited and patterned layers.

(2) Description of Related Art

In the fabrication of semiconductor components, metal conductor lines are used to interconnect the many components in device circuits. The metal conductor lines serve to interconnect discrete devices, and thus form integrated circuits. The metal conductor lines are further insulated from the next interconnection level by thin layers of insulating material and holes formed through the insulating layers provide electrical access between successive conductive interconnection layers. In such wiring processes, it is desirable that the insulating layers have a smooth surface topography, since it is difficult to lithographically image and pattern layers applied to rough surfaces. Also, rough surface topography results in poor step coverage by subsequently deposited layers, discontinuity of layers across steps, and void formation between topographic features. Poor step coverage by deposited layers and void formation between topographic features result in degraded process yield and poorer reliability of integrated circuits. As wiring densities in semiconductor circuit chips increase, multiple wiring levels are required to achieve interconnection of the devices, and, therefore, planarization of the interlevel dielectric becomes a critical step in the fabrication process.

Recently chemical-mechanical polishing (CMP) has been developed for providing smooth insulator topographies. CMP can also be used to remove different layers of material from the surface of a semiconductor substrate. For example, following via hole formation in an insulating material layer, a metallization layer is blanket deposited and then CMP is used to produce planar metal studs. Briefly, the CMP processes involve holding and rotating a thin, flat substrate of the semiconductor material against a wetted polishing surface under controlled chemical, pressure, and temperature conditions. A chemical slurry containing a polishing agent, such as alumina or silica, is used as the abrasive material. Additionally, the chemical slurry contains selected chemicals which etch various surfaces of the substrate during processing. The combination of mechanical and chemical removal of material during polishing results in superior planarization of the polished surface. In polishing processes it is important to remove a sufficient amount of material to provide a smooth surface, without removing an excessive amount of underlying materials. Therefore, a method of detecting when planarization is achieved is needed.

U.S. Pat. No. 5,413,941 entitled "Optical End Point Detection Methods in Semiconductor Planarizing Polishing Processes" granted May 9, 1995 to Daniel A. Koos et al describes a method of detecting planarization endpoint for polishing by impinging laser light onto the surface being polished and measuring the reflected light. The intensity of the reflected light is a measure of the planarity of the polished surface.

Chemical-mechanical planarization of insulator layers has, also, been monitored by measuring the thickness of the insulator layer and relating the amount of layer removed to the state of planarization. This is an unreliable method because the CMP process is dependent on the topographic pattern density and, therefore, simply measuring the thickness of removed material does not guarantee planarization.

Since it is desirable to monitor and detect surface planarization in situ, without removing the object from the CMP planarization apparatus, optical thickness monitoring methods, such as optical interferometry, are often used because these methods are inexpensive and easily adapted to chemical-mechanical polishing apparatuses. However, merely monitoring thickness of material removed during CMP does not insure that planarization has been achieved, because the local removal rates on the object being polished are dependent on the initial topography of the object. Consider an object whose topography varies in both height of features and lateral dimensions of features. CMP polish removal rate is enhanced on features of larger height compared to smaller height. Also, planarization of surface features depends upon their lateral dimensions for a given feature height. The local polish removal rate over a feature with small lateral dimensions is higher than the local polish removal rate over a feature with large lateral dimensions. Furthermore, the local polish removal rate on a topographic feature is influenced by the proximity of other topographic features. An isolated feature of a given height will polish faster than a like feature which is embedded within an array of similar features. The inadequacy of merely monitoring thickness of material removed during CMP of semiconductor device structures is readily apparent. Each level of a semiconductor device structure has a different pattern density and this pattern density may vary both locally and globally across the semiconductor substrate. Therefore, merely measuring the thickness of material removed during CMP at an individual site on the substrate does not adequately predict planarization.

The present invention is directed to a novel method for detecting CMP planarization endpoint when polishing to a planar condition a semiconductor substrate which contains topographic features, resulting from deposited and patterned layers. The method is independent of topographic pattern density and is applicable to planarization of various insulator layers. The method depends on simple optical film thickness measurements which are easily implemented at low cost.

SUMMARY OF THE INVENTION

One object of the present invention is to provide an improved and new process for chemical-mechanical planarization (CMP) of a substrate surface, wherein endpoint for the planarization process is detected by monitoring the ratio of the rate of insulator material removal over a pattern feature to the rate of insulator material removal over an area without an underlying pattern feature.

Another object of the present invention is to provide a new and improved process for endpoint detection in a CMP process for planarizing an insulator layer deposited over a patterned metallization layer used to interconnect discrete devices on a semiconductor substrate.

The novel features of the polishing method in accordance with the invention comprise: depositing a first insulating layer on a semiconductor substrate; forming a metallization pattern on the first insulating layer; conformally depositing a second insulating layer over the first insulating layer and over the metallization pattern; measuring the thickness of the second insulating layer over the metallization pattern; measuring the combined thicknesses of the second insulating layer and the first insulating layer over the semiconductor substrate; performing chemical-mechanical polishing of the second insulating layer; remeasuring, after chemical-mechanical polishing, the thickness of the second insulating layer over the metallization pattern; remeasuring, after chemical-mechanical polishing, the combined thicknesses of the second insulating layer and the first insulating layer over the semiconductor substrate; computing a first polish removal rate of the second insulating layer over the metallization pattern; computing a second polish removal rate of the second insulating layer over the semiconductor substrate; computing a polish removal rate ratio by dividing the first polish removal rate by the second polish removal rate; and performing additional chemical-mechanical polishing until the polishing removal rate ratio is less than between about 0.9 to 1.1. Alternately, a second polish removal rate ratio may be computed by dividing the second polish removal rate by the first polish removal rate and additional chemical-mechanical polishing is performed until this second polish removal rate ratio is greater than between about 1.1 to 0.9.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of planarizing the surface of a semiconductor substrate, using chemical-mechanical polishing (CMP), which results in an improved method for detecting planarization endpoint, will now be described in detail. The method can be used for planarizing insulator surfaces, such as silicon oxide or silicon nitride, deposited by chemical vapor deposition or other means, over semiconductor devices and/or conductor interconnection wiring patterns.

This invention comprises a planarization monitoring structure and method of detecting planarization during CMP, wherein the endpoint for the planarization process is predicted by monitoring the ratio of the rate of material removal over a pattern feature to the rate of material removal over an area without an underlying pattern feature.

The planarization monitoring structure is an optical measuring alignment mark, comprising a first area which is devoid of an underlying topographic producing feature and a second area which has an underlying topographic producing feature. The lateral dimensions of this optical measuring alignment mark are approximately 100 microns by 100 microns for the first area and approximately 100 microns by 100 microns for the second area. The lateral dimensions of the two areas of the alignment mark are chosen so that optical thickness measurement techniques, such as optical interferometry, can be implemented in-situ on a CMP polishing apparatus without undue and costly optical tool alignment requirements. Secondly, the lateral dimensions of the second area which has an underlying topographic producing feature are chosen so that achievement of planarization over this feature insures planarization of all critical areas of the semiconductor device structure. Lateral dimensions of approximately 100 microns by 100 microns for the underlying topographic producing feature generally meet this criterion, but these dimensions may be changed to meet the specific needs of the process. For example, lateral dimensions between about 50 to 1,000 microns are suitable for the underlying topographic producing feature.

The optical measuring alignment mark is produced on the substrate at a defined position relative to a defined substrate feature, such as a substrate flat or notch on a silicon wafer substrate. Both silicon substrate flats or notches are commonly used in the semiconductor industry. According to this method the location of the alignment mark is always well-defined and optical measuring devices can be focused on the alignment mark with relative ease.

Figure 1A:
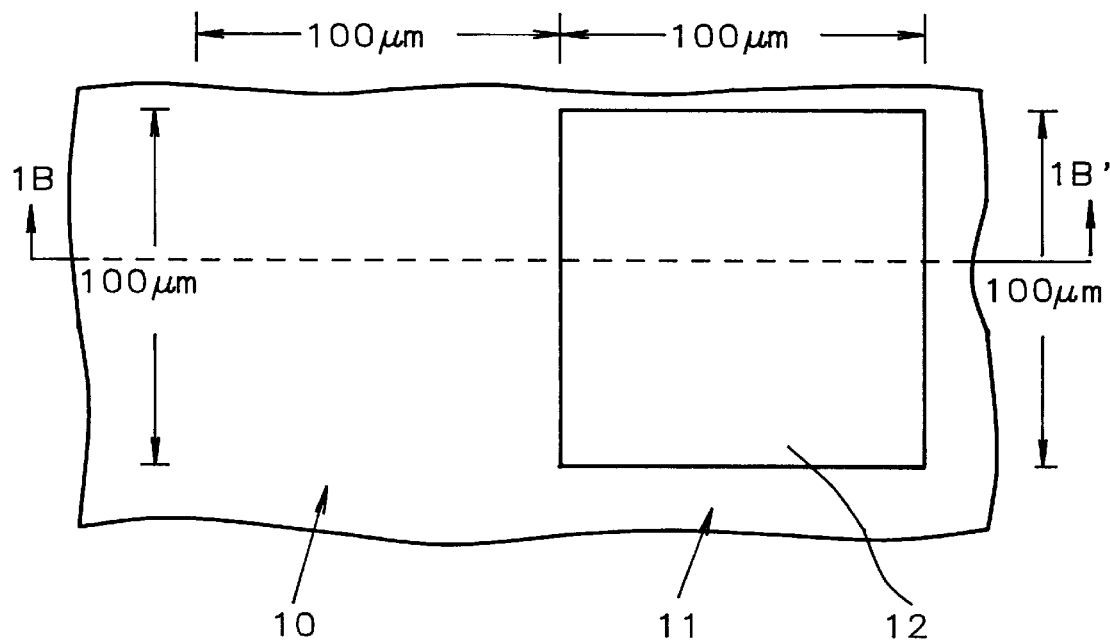
FIG. 1A, which schematically illustrates a top view of the optical alignment mark of the invention.
Figure 1B:
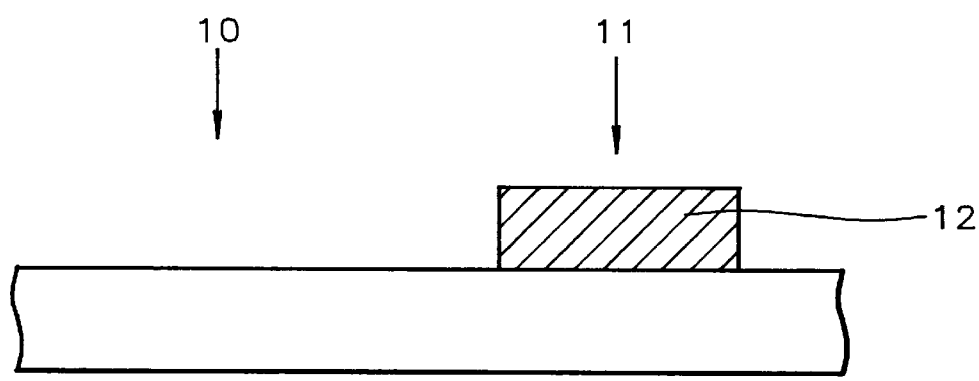
FIG. 1B, which schematically, in cross-sectional representation, illustrates the optical alignment mark shown in FIG. 1A.

FIGS. 1A and 1B schematically show the optical alignment measuring mark described above. FIG. 1A shows the top view of the alignment mark comprising a first area, 10, which is devoid of any topographic feature and a second area, 11, having a topographic feature, 12. The lateral dimensions of the topographic feature, 12, are approximately 100 $\mu$m by 100 $\mu$m. Said first area, 10, has lateral dimensions of approximately 100 microns by 100 microns. FIG. 1B is a cross-sectional representation of the alignment mark shown in FIG. 1A.

Figure 2:
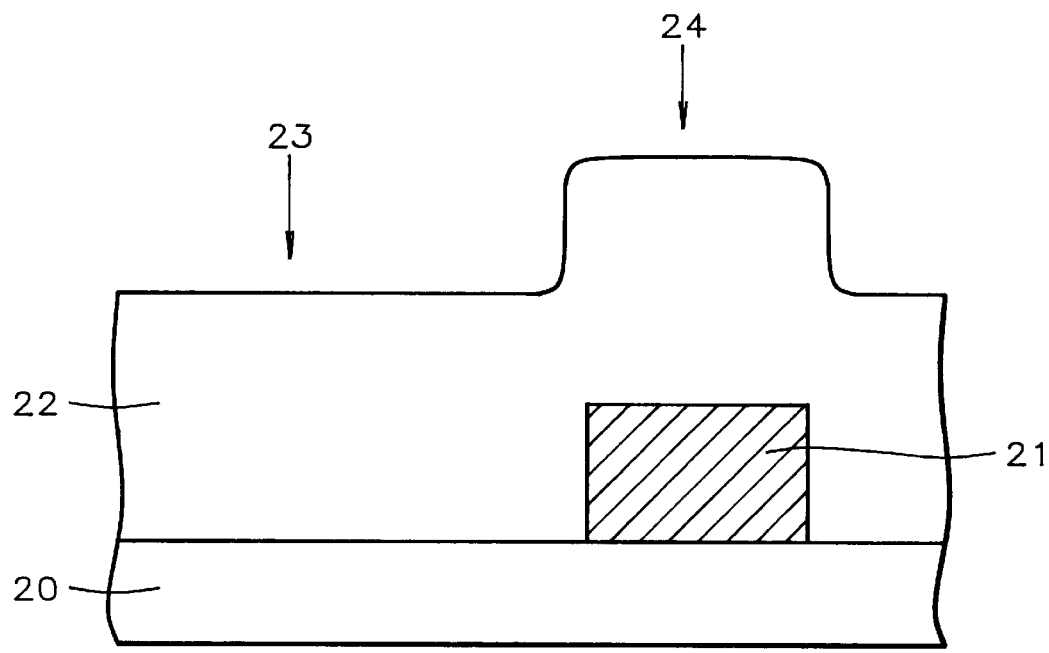
FIG. 2, which schematically, in cross-sectional representation, illustrates the optical alignment mark prior to planarization by CMP.
Figure 3:
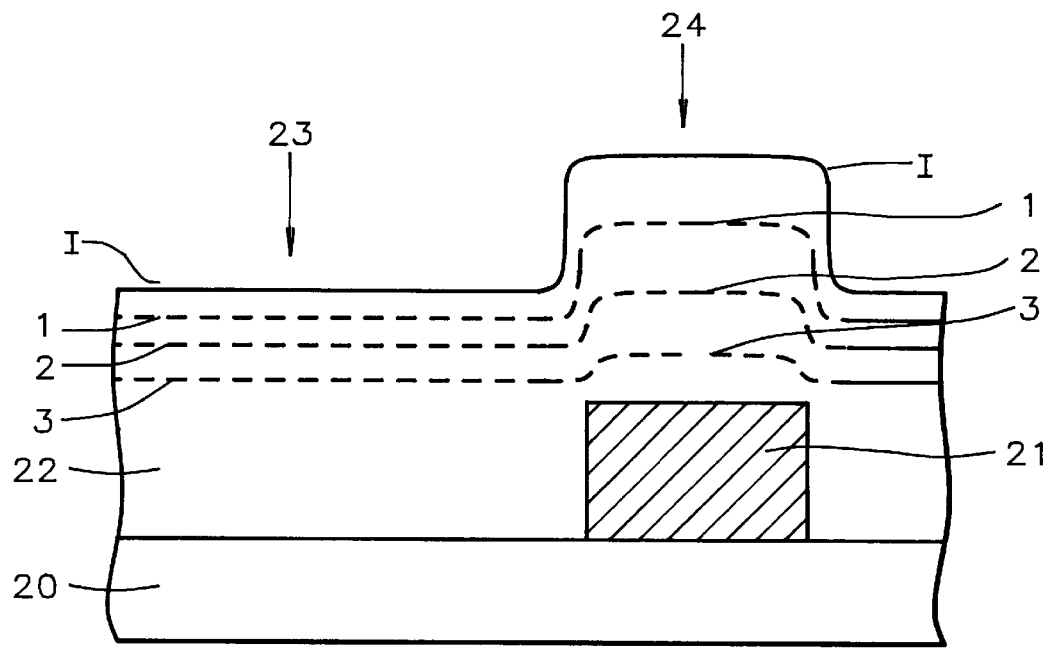
FIG. 3, which schematically, in cross-sectional representation, illustrates progression of planarization at the optical alignment mark during successive CMP operations.

FIGS. 2 and 3 schematically represent the use of the optical alignment mark to monitor planarization during CMP of a semiconductor device structure. FIG. 2 shows a cross-sectional representation of the initial monitor structure. Insulator, 20, is deposited by CVD (Chemical Vapor Deposition), LPCVD (Low Pressure Chemical Vapor Deposition), or PECVD (Plasma Enhanced Chemical Vapor Deposition), all common to the semiconductor industry. Insulator, 20, may bee silicon oxide deposited using PECVD processing, at a temperature between about 200 to 450° C., to a thickness between about 2,000 to 20,000 Angstroms, using $SiH_4$ or TEOS (Tetraethylorthosilicate), at a flow between about 10 to 200 sccm. Alternately, insulator, 20, may be deposited by SOGC (Spin On Glass) and reflow techniques, also common to the semiconductor industry. Topographic feature, 21, comprises an island of metal having lateral dimensions approximately 100 microns by 100 microns and is formed by patterning and subtractive etching of a blanket metal layer. Topographic feature, 21, is formed at the same time that an interconnection wiring pattern is formed on the semiconductor substrate. The metal island may be aluminum or aluminum-copper-silicon having a thickness between about 3,000 to 8,000 Angstroms. Insulator layer, 22, is conformally deposited over the first insulating layer, 20, over the topographic feature, 21, and over the interconnection wiring pattern (not shown here, because this is not part of this invention). Insulator layer, 22, may be silicon oxide deposited using PECVD processing, at a temperature between about 200 to 450° C., to a thickness between about 2,000 to 20,000 Angstroms, using $SiH_4$ or TEOS (Tetraethylorthosilicate), at a flow between about 10 to 200 sccm. Alternately, insulator, 22, may be deposited by SOG (Spin On Glass) and reflow techniques, also common to the semiconductor industry. Initial insulator thickness measurements are taken in region, 24, above topographic feature, 21, and in region, 23, which is devoid of topographic features. Optical interferometry, commonly used in the industry, may be used to measure these initial insulator thicknesses.

Referring again to FIG. 3, chemical-mechanical planarization (CMP) is then performed for a selected time, using a polishing slurry comprising abrasive particles, such as alumina or silica, and a chemical etchant at a pH between about pH=9 to pH=14. During CMP the polishing pad is rotated at a speed between about 10 to 100 rpm and the substrate carrier is rotated at a speed between about 10 to 100 rpm. The applied pressure between the rotatable substrate carrier and the rotatable polishing pad is between about 0.1 to 10 psi. Following CMP, insulator thicknesses in region 23 and in region 24 are again measured by optical interferometric techniques. For illustrative purpose the initial topographic surface is labelled I and the first polished topographic surface is labelled 1. CMP material removal rates are calculated for both regions 23 and 24 by subtracting the corresponding insulator thickness after CMP from the corresponding initial insulator thickness and dividing this difference by the elapsed polishing time. A CMP polish removal rate ratio is then calculated by dividing the removal rate in region 24 by the removal rate in region 23. Typically the removal rate in region 24 will be greater than the removal rate in region 23, indicating that planarization is progressing. Subsequent polished topographic surfaces are labelled 2 and 3 and further illustrate the progression of planarization. After each polish iteration new material removal rates are calculated for both regions 23 and 24. Also, a CMP polish removal rate ratio is calculated after each polish iteration. Typically the CMP polish removal rate ratio will progress from a large numerical value to a numerical value approaching 1.00 as planarization progresses. Additional chemical-mechanical polishing is performed until said polishing removal rate ratio is less than between about 0.9 to 1.1. Alternately, a second polish removal rate ratio may be computed by dividing the removal rate in region 23 by the removal rate in region 24 and additional chemical-mechanical polishing is performed until said second polish removal rate ratio is greater than between about 1.1 to 0.9.

While the invention has been particularly shown and described with reference to the preferred embodiments thereof, it will be understood by those skilled in the art that various changes in form and details may be made without departing from the spirit and scope of the invention.

What is claimed is:

1. A method for determining planarization endpoint in chemical-mechanical polishing during integrated circuit fabrication on a semiconductor substrate, comprising the steps of:

depositing a silicon oxide layer using PECVD processing, at a temperature between about 200° to 450° C., to a thickness between about 2,000 to 20,000 Angstroms, using $SiH_4$ or TEOS at a flow between about 10 to 200 sccm;

forming a metallization pattern on said silicon oxide layer;

conformally depositing an insulating layer over said silicon oxide layer and said metallization pattern;

measuring the thickness of said insulating layer over said metallization pattern;

measuring the combined thicknesses of said insulating layer and said silicon oxide layer over said semiconductor substrate;

performing chemical-mechanical polishing of said insulating layer;

remeasuring, after chemical-mechanical polishing, the thickness of said insulating layer over said metallization pattern;

remeasuring, after chemical-mechanical polishing, the combined thicknesses of said insulating layer and said silicon oxide layer over said semiconductor substrate;

computing a first Polish removal rate of said insulating layer over said metallization pattern;

computing a second polish removal rate of said insulating layer over said semiconductor substrate;

computing a polish removal rate ratio by dividing said first polish removal rate by said second polish removal rate; and performing additional chemical-mechanical polishing until said polish removal rate ratio is less than about 1.1.

2. A method for determining planarization endpoint in chemical-mechanical polishing during integrated circuit fabrication on a semiconductor substrate, comprising the steps of:

depositing an insulating layer on said semiconductor substrate;

forming a metallization pattern on said insulating layer;

conformally depositing over said first insulating layer and said metallization pattern, a silicon oxide layer using PECVD processing, at a temperature between about 200° to 450° C., to a thickness between about 2,000 to 20,000 Angstroms, using $SiH_4$ or TEOS at a flow between about 10 to 200 sccm;

measuring the thickness of said silicon oxide layer over said metallization pattern;

measuring the combined thicknesses of said silicon oxide layer and said insulating layer over said semiconductor substrate;

performing chemical-mechanical polishing of said silicon oxide layer;

remeasuring, after chemical-mechanical polishing, the thickness of said silicon oxide layer over said metallization pattern;

remeasuring, after chemical-mechanical polishing, the combined thicknesses of said silicon oxide layer and said insulating layer over said semiconductor substrate;

computing a first polish removal rate of said silicon oxide layer over said metallization pattern;

computing a second polish removal rate of said silicon oxide layer over said semiconductor substrate;

computing a polish removal rate ratio by dividing said first polish removal rate by said second polish removal rate; and performing additional chemical-mechanical polishing until said polish removal rate ratio is less than about 1.1.

3. A method for determining planarization endpoint in chemical-mechanical polishing during integrated circuit fabrication on a semiconductor substrate, comprising the steps of:

depositing a silicon oxide layer using PECVD processing, at a temperature between about 200° to 450° C., to a thickness between about 2,000 to 20,000 Angstroms, using $SiH_4$ or TEOS at a flow between about 10 to 200 scam;

forming a metallization pattern on said silicon oxide layer;

conformally depositing an insulating layer over said silicon oxide layer and said metallization pattern;

measuring the thickness of said insulating layer over said metallization pattern;

measuring the combined thicknesses of said insulating layer and said silicon oxide layer over said semiconductor substrate;

performing chemical-mechanical polishing of said insulating layer;

remeasuring, after chemical-mechanical polishing, the thickness of said insulating layer over said metallization pattern;

remeasuring, after chemical-mechanical polishing, the combined thicknesses of said insulating layer and said silicon oxide layer over said semiconductor substrate;

computing a first Polish removal rate of said insulating layer over said metallization pattern;

computing a second polish removal rate of said insulating layer over said semiconductor substrate;

computing a polish removal rate ratio by dividing said second polish removal rate by said first polish removal rate; and performing additional chemical-mechanical polishing until said polish removal rate ratio is greater than about 0.9.

4. A method for determining planarization endpoint in chemical-mechanical polishing during integrated circuit fabrication on a semiconductor substrate, comprising the steps of:

depositing an insulating layer on said semiconductor substrate;

forming a metallization pattern on said insulating layer;

conformally depositing over said first insulating layer and said metallization pattern, a silicon oxide layer using PECVD processing, at a temperature between about 200° to 450° C., to a thickness between about 2,000 to 20,000 Angstroms, using $SiH_4$ or TEOS at a flow between about 10 to 200 sccm;

measuring the thickness of said silicon oxide layer over said metallization pattern;

measuring the combined thicknesses of said silicon oxide layer and said insulating layer over said semiconductor substrate;

performing chemical-mechanical polishing of said silicon oxide layer;

remeasuring, after chemical-mechanical polishing, the thickness of said silicon oxide layer over said metallization pattern;

remeasuring, after chemical-mechanical polishing, the combined thicknesses of said silicon oxide layer and said insulating layer over said semiconductor substrate;

computing a first polish removal rate of said silicon oxide layer over said metallization pattern;

computing a second polish removal rate of said silicon oxide layer over said semiconductor substrate;

computing a polish removal rate ratio by dividing said second polish removal rate by said first polish removal rate; and performing additional chemical-mechanical polishing until said polish removal rate ratio is greater than about 0.9.

* * * * *